(12) United States Patent
Kim et al.

(10) Patent No.: US 8,975,327 B2
(45) Date of Patent: Mar. 10, 2015

(54) CONTROLLING MORPHOLOGY OF BLOCK COPOLYMERS

(75) Inventors: Ginam Kim, Midland, MI (US); Steven Swier, Midland, MI (US)

(73) Assignee: Dow Corning Corporation, Midland, MI (US)

(*) Notice: Subject to any disclaimer, the term of this patent is extended or adjusted under 35 U.S.C. 154(b) by 0 days.

(21) Appl. No.: 13/885,250

(22) PCT Filed: Nov. 21, 2011

(86) PCT No.: PCT/US2011/061663
§ 371 (c)(1),
(2), (4) Date: May 14, 2013

(87) PCT Pub. No.: WO2012/071330
PCT Pub. Date: May 31, 2012

(65) Prior Publication Data
US 2013/0231438 A1 Sep. 5, 2013

Related U.S. Application Data

(60) Provisional application No. 61/416,848, filed on Nov. 24, 2010.

(51) Int. Cl.
*C08L 83/10* (2006.01)
*C09J 183/10* (2006.01)
*B82Y 10/00* (2011.01)
*C08G 77/04* (2006.01)
*C08G 77/00* (2006.01)

(52) U.S. Cl.
CPC ............ *C08L 83/10* (2013.01); *B82Y 10/00* (2013.01); *C09J 183/10* (2013.01); *C08G 77/04* (2013.01); *C08G 77/70* (2013.01)
USPC ..... 524/500; 525/477; 427/208.2; 427/208.4; 427/379; 427/387

(58) Field of Classification Search
CPC ......... C08L 83/10; C09J 183/10; B82Y 10/00
USPC ............. 524/500; 525/477; 427/208.2, 208.4, 427/379, 387
See application file for complete search history.

(56) References Cited

U.S. PATENT DOCUMENTS

| | | | |
|---|---|---|---|
| 5,866,222 A * | 2/1999 | Seth et al. | 428/41.4 |
| 7,037,744 B2 | 5/2006 | Colburn et al. | |
| 7,045,851 B2 | 5/2006 | Black et al. | |
| 7,651,760 B2 | 1/2010 | Gleason et al. | |
| 7,956,150 B2 | 6/2011 | Lin et al. | |
| 8,247,357 B2 | 8/2012 | Joffre et al. | |
| 2006/0292369 A1 | 12/2006 | Rutledge et al. | |
| 2007/0148473 A1* | 6/2007 | Moore et al. | 428/447 |
| 2008/0193658 A1 | 8/2008 | Millward | |
| 2010/0130082 A1 | 5/2010 | Lee et al. | |
| 2010/0178505 A1 | 7/2010 | Rutledge et al. | |

FOREIGN PATENT DOCUMENTS

GB 972594 10/1964

OTHER PUBLICATIONS

Park, Cheolmin, et al.; Enabling nanotechnology with self assembled block copolymer patterns, Polymer 44 (2003) 6725-6760.
Choi, Philip et al., Siloxane Copolymers for Nanoimprint Lithography, Adv. Fund. Mater. 2007, 17, 65-70.
Saam, John C., et al., Block Copolymers of Polydimethylsiloxane and Polystyrene, Macromolecules, vol. 3, No. 1, Jan.-Feb. 1970.
Zilliox, J. G., et al., Preparation and Properties of Polydimethylsiloxane and Its Block Copolymers with Styrene, Chemistry Diuision, National Research Council of Canada, Ottawa KIA OR9, Canada. Received Apr. 28, 1975, Macromolecules 1975, vol. 8, No. 5, Sep.-Oct. 1975.
Bang, Joona et al., Defect-Free Nanoporous Thin Films from ABC Triblock Copolymers, J. Am. Chem. Soc. 2006, 128, 7622-7629.
Ndoni, Sokol, et al., Nanoporous Materials with Spherical and Gyroid Cavities Created by Quantitative Etching of Polydimethylsiloxane in Polystyrene-Polydimethylsiloxane Block Copolymers, J. Am. Chem. Soc. 2003, 125, 13366-13367.
Jung, Yeon Sik, et al., Orientation-Controlled Self-Assembled Nanolithography Using a Polystyrene-Polydimethylsiloxane Block Copolymer, Nano Letters, 2007, vol. 7, No. 7, 2046-2050.
Welander, Adam M., Rapid Directed Assembly of Block Copolymer Films at Elevated Temperatures, Macromolecules 2008; 41; 2759.
Jung, Yeon Sik, et al., A Path to Ultranarrow Patterns Using Self-Assembled Lithography, Nano Letters, 2010, 10, 1000-1005.
Morton, Maurice et al., Block Copolymerization of Unsaturated Monomers and Octamethylcyclotetrasiloxane, Journal of Applied POLYMhX Science vol. 8, pp. 2707-2716 (1964).
Szwarc, M., 'Living' Polymers, Nature, No. 4543, Nov. 24, 1956, 1168-1169.

* cited by examiner

*Primary Examiner* — Michael M Bernshteyn
(74) *Attorney, Agent, or Firm* — John M. Olivo

(57) ABSTRACT

A method for controlling morphology of a silicone organic block copolymer includes adding an MQ resin to the silicone organic block copolymer and annealing. The method is useful for forming thin films, which are useful in electronic device fabrication. The method is also useful for forming adhesives, release coatings, and reversible elastomers.

20 Claims, No Drawings

CONTROLLING MORPHOLOGY OF BLOCK COPOLYMERS

CROSS REFERENCE TO RELATED APPLICATIONS

This application is a U.S. national stage filing under 35 U.S.C. §371 of PCT Application No. PCT/US11/61663 filed on Nov. 21, 2011, currently pending, which claims the benefit of U.S. Patent Application No. 61/416,848 filed Nov. 24, 2010 under 35 U.S.C. §119(e). PCT Application No. PCT/US11/61663 and U.S. Patent Application No. 61/416,848 are hereby incorporated by reference.

BACKGROUND OF THE INVENTION

Block copolymers contain chemically distinct polymer chains (blocks) covalently linked to form a single molecule. Block copolymers may exhibit chemically directed self assembly to form different structured morphologies, such as cylindrical morphology, gyroid morphology, or lamellar morphology. Owing to their mutual repulsion, dissimilar blocks within the molecule tend to segregate or phase separate into different domains, the spatial extent of the domains being limited by the constraint imposed by the chemical connectivity of the blocks. From an entropic standpoint, the molecules may prefer random coil shapes, but the blocks may be stretched away from the interface to avoid unfavorable contacts. As a result of these competing effects, self-organized, structured morphologies emerge on the nanoscopic length scale. Various microdomain structures can be achieved, depending on relative volume ratio between blocks and chain architecture, as well as the chain lengths of the respective blocks. These microstructures may satisfy the size requirement for many potential nanotechnologies.

Nanometer scale patterns based on self assembly of block copolymers have been considered as alternatives to replace or augment high resolution lithographic technologies. In particular, self assembly of block copolymers has received attention because of the scale of the microdomains (e.g., on the order tens of nanometers), their various chemical and physical properties (e.g., differential etching rates) and the size and shape tunability of microdomains afforded by changing the molecular weights and compositions of the blocks making up the copolymers. As a "bottom up" molecular system, block copolymer lithography allows some control over the size and the two-dimensional arrangement of nanoscale features. By changing the molecular weight, and/or the relative ratio of constituent blocks, the morphology and size scales of the features can be controlled. In terms of thin films, the nanoporous materials derived from block copolymers have also been studied as nano-templates, membranes, separation media, high surface area support for catalysts, and sensors. The self assembly of block copolymers has been considered as a route to nanostructured materials and has led to the development of block copolymer lithography as a technique used in fabricating microelectronic devices.

However, the use of block copolymers in lithographic technologies suffers from the drawback that for each morphology and size of the feature desired, a different block copolymer must be synthesized because the molecular weight and/or relative ratio of constituent blocks must be changed.

BRIEF SUMMARY OF THE INVENTION

A method for controlling morphology of a block copolymer (copolymer) includes adding a MQ resin to the copolymer and annealing.

DETAILED DESCRIPTION OF THE INVENTION

Definitions and Usage of Terms

All amounts, ratios, and percentages described herein are by weight unless otherwise indicated. The articles 'a', 'an', and 'the' each refer to one or more, unless otherwise indicated by the context of specification. The disclosure of ranges includes the range itself and also anything subsumed therein, as well as endpoints. For example, disclosure of a range of 2.0 to 4.0 includes not only the range of 2.0 to 4.0, but also 2.1, 2.3, 3.4, 3.5, and 4.0 individually, as well as any other number subsumed in the range. Furthermore, disclosure of a range of, for example, 2.0 to 4.0 includes the subsets of, for example, 2.1 to 3.5, 2.3 to 3.4, 2.6 to 3.7, and 3.8 to 4.0, as well as any other subset subsumed in the range. Similarly, the disclosure of Markush groups includes the entire group and also any individual members and subgroups subsumed therein. For example, disclosure of the Markush group: an alkyl group, a cycloalkyl group, an alkenyl group, an alkynyl group, or an aryl group; includes the member alkyl individually; the subgroup alkyl and aryl; and any other individual member and subgroup subsumed therein.

The term 'annealing' (and variants thereof such as 'anneal' and 'annealed') means forming structured morphology. For example, annealing may be performed by heating a combination of a block copolymer and a silicate having an amorphous morphology, thereby causing the combination to self assemble to have a structured morphology.

"Block copolymer" means chemically distinct polymer chains (blocks) covalently linked to form one single molecule. A "silicone organic block copolymer" (copolymer) contains polyorganosiloxane blocks and organic blocks.

"Combination of Ingredients A) and B)" means a physical blend and/or a reaction product of the MQ resin and the block copolymer described herein. The Combination of Ingredients A) and B) may optionally further comprise one or more other ingredients, provided that the amount and type of the other ingredient does not prevent the Combination of Ingredients A) and B) from forming the structured morphology in the method described herein.

MQ Resin

As used herein, "MQ resin" refers to a silicone resin containing at least one $SiO_{4/2}$ siloxy unit chemically bonded to at least one $R_3SiO_{1/2}$ siloxy unit. The MQ resin may be one silicone resin. Alternatively, the MQ resin may comprise two or more silicone resins, where the resins differ in at least one of the following properties: structure, hydroxyl and/or hydrolyzable group content, molecular weight, siloxane units, and sequence.

The silicone resins useful herein include those resins containing monofunctional (M) units represented by $R_3SiO_{1/2}$, and tetrafunctional (Q) units represented by $SiO_{4/2}$, where each R is independently a monovalent hydrocarbon group, (MQ resin). Suitable hydrocarbon groups for R include an alkyl group, a cycloalkyl group, an alkenyl group, an alkynyl group, or an aryl group. Suitable alkyl groups are exemplified by methyl, ethyl, propyl, pentyl, octyl, undecyl, and octadecyl groups. Suitable cycloalkyl groups are exemplified by cyclopentyl and cyclohexyl groups. Suitable alkenyl groups are exemplified by vinyl, allyl, butenyl, and hexenyl. Suitable alkynyl groups are exemplified by ethynyl, propynyl, and butynyl groups. Suitable aryl groups are exemplified by phenyl, tolyl, xylyl, benzyl and 2-phenylethyl. Alternatively, each R may be selected from alkyl groups and aryl groups.

Alternatively, each R may be a methyl group or a phenyl group. Alternatively, each R may be a methyl group.

The MQ resin may have a weight average molecular weight (Mw) ranging from 1,000 to 50,000, alternatively 4,000 to 15,000, and alternatively 4,000 to 10,000. The MQ resin may have a ratio of M units to Q units (M/Q ratio) ranging from 0.7 to 3, alternatively 0.7 to 1.1. The MQ resin may have a content of silicon-bonded hydroxy groups of less than 3%, alternatively less than 1.5%.

MQ resins may be polymeric silicone resins having M units bonded to Q units, each of which is bonded to at least one other Q unit. Some of the Q units are bonded to hydroxyl groups resulting in trifunctional (TOH) units represented by $HOSiO_{3/2}$, thereby accounting for the silicon-bonded hydroxyl content of the MQ resin, and some are bonded only to other Q units. Such resins are described in, for example, U.S. Pat. No. 2,676,182 to Daudt, et al., U.S. Pat. No. 3,627,851 to Brady, U.S. Pat. No. 3,772,247 to Flannigan, and U.S. Pat. No. 5,248,739 to Schmidt, et al.

Suitable MQ resins can be prepared by any method which provides a soluble resin consisting essentially of M and Q units which meet the requirements described above. Such MQ resins may be prepared by the silica hydrosol capping process described in U.S. Pat. No. 2,676,182 to Daudt, et al., U.S. Pat. No. 3,627,851 to Brady, and U.S. Pat. No. 3,772,247 to Flannigan. Briefly stated, the method of Daudt, et al. involves reacting a silica hydrosol under acidic conditions with a hydrolyzable triorganosilane such as trimethylchlorosilane, a siloxane such as hexamethyldisiloxane, or a mixture thereof, followed by recovery of a resin having M and Q units. The resin may contain 2% to 5% of hydroxyl groups. Resins containing less than 2% silicon bonded hydroxyl groups may then be prepared by reacting the resin with an endblocking agent. Some suitable endblocking agents include silazanes, siloxanes, and silanes; and endblocking agents are described in U.S. Pat. No. 4,584,355 (Apr. 22, 1986), U.S. Pat. No. 4,585,836 (Apr. 29, 1986), and U.S. Pat. No. 4,591,622 (May 22, 1986). A single endblocking agent or a mixture of endblocking agents may be used to prepare such organosiloxane resins.

Alternatively, the process for making the MQ resin may include limiting the concentration of the sodium silicate solution, and/or the silicon-to-sodium ratio in the sodium silicate, and/or the time before capping the neutralized sodium silicate solution to generally lower values than those disclosed by Daudt, et al. The neutralized silica hydrosol may be stabilized with an alcohol, such as 2-propanol, and capped with M units as soon as possible after being neutralized. The level of silicon bonded hydroxyl groups on the MQ resin may be reduced, for example to less than 1.5%, alternatively to no greater than 1.2%, alternatively to no greater than 1.0%, and alternatively to no greater than 0.8%. This may be accomplished, for example, by reacting and endblocking agent such as hexamethyldisilazane with the MQ resin. Such a reaction may be catalyzed, for example, with trifluoroacetic acid. Alternatively, trimethylchlorosilane or trimethylsilylacetamide may be reacted with the MQ resin, a catalyst not being necessary in this case. Such reactions may be performed in solvent.

Various suitable MQ resins are commercially available from sources such as Dow Corning Corporation of Midland, Mich., U.S.A., Momentive Performance Materials of Albany, N.Y., U.S.A., and Bluestar Silicones USA Corp. of East Brunswick, N.J., U.S.A. For example, DOW CORNING® MQ-1600 Solid Resin, DOW CORNING® MQ-1601 Solid Resin, and DOW CORNING® 1250 Surfactant, DOW CORNING® 7466 Resin, and DOW CORNING® 7366 Resin, all of which are commercially available from Dow Corning Corporation, are suitable for use in the methods described herein. Other examples of suitable MQ resins are disclosed in U.S. Pat. No. 5,082,706 to Tangney. Such resins are may be supplied in organic solvent.

Suitable MQ resins may have polydispersity ranging from 1 to 5. Polydispersity may be measured using Gel Permeation Chromatography and dividing Mw/Mn (weight average molecular weight/number average molecular weight). The polydispersity of an MQ resin may be decreased by fractionation using conventional techniques such as gel permeation chromatography or supercritical fluid fractionation. Alternatively, the MQ resin may have polydispersity ranging from 1 to 3. Without wishing to be bound by theory, it is thought that MQ resins having polydispersity values at the lower end of the range described herein may be more efficient at modifying the structured morphology of the block copolymer.

The amount of MQ resin combined with the copolymer is sufficient to change the structured morphology of the Combination of Ingredients A) and B) to be different from the structured morphology ingredient B) would form in the absence of ingredient A). The exact amount may depend on various factors including the type of block copolymer selected for ingredient B), the type of MQ resin selected for ingredient A), the polydispersity of the MQ resin, the desired structured morphology, and the end use of the Combination of Ingredients A) and B). However, the amount of ingredient A) may range from greater than 0% to 80%, alternatively 10% to 80%, alternatively 10% to 25%, and alternatively 5% to 25%, based on the combined weight the MQ resin and the block copolymer in the Combination of Ingredients A) and B). The amount of MQ resin in the Combination of Ingredients A) and B) can affect the levels of release and peel forces of release coatings and/or adhesives made with Combination of Ingredients A) and B). For example, cylindrical and/or lamellar morphologies may be useful for nanolithography applications. Gyroid morphology may be used to improve toughness and deformation resistance, therefore, gyroid morphology may be useful for optimizing permeability and/or strength of membranes.

Without wishing to be bound by theory, it is thought that the addition of ingredient A) changes the size of the domains of ingredient B) when the Combination of Ingredients A) and B) self assembles because ingredient A) is more compatible with a certain block of the copolymer than with another block of the copolymer; i.e., addition of a sufficient amount of the MQ resin is thought to increase the size of one domain as compared to another domain, thereby changing the structured morphology. For example, when a silicone organic block copolymer is selected for ingredient B), it is thought that ingredient A) is more compatible with the siloxane blocks of the copolymer than with the organic blocks; i.e., addition of a sufficient amount of the MQ resin is thought to increase the size of the silicone domains, thereby changing the structured morphology.

Block Copolymer

The block copolymer useful herein may be any block copolymer that will self assemble to have a structured morphology when annealed. The copolymer may have one or more blocks that are relatively compatible with the MQ resin, and the copolymer may have one or more blocks that are relatively incompatible with the MQ resin. In general, the molecular weights of the blocks in the block copolymer should sufficient to permit the block copolymer to phase segregate. The exact value for these molecular weights will vary depending on the type of block copolymer, however, the lower limit may be 1,000 for each block. The block copolymer may have a relatively low polydispersity, e.g., polydispersity≤1.2, alternatively polydispersity may range from 1 to less than 1.2.

Suitable block copolymers may be organic block copolymers (i.e., having two or more different organic blocks), or silicone organic block copolymers (i.e., having one or more siloxane blocks and one or more organic blocks). Exemplary organic block copolymers include diblock copolymers including but not limited to poly(meth)acrylate based diblock copolymers, polydiene based diblock copolymers, polyisobutylene based diblock copolymers, polystyrene based diblock copolymers, polyvinylnaphthalene based diblock copolymers, polyvinylpyridine based diblock copolymers, polypropylene oxide based diblock copolymers, adipic anhydride based diblock copolymers, polyolefin based diblock copolymers, polylactone or polyactide based diblock copolymers, and combinations thereof; amphiphilic block copolymers including but not limited to poly((meth)acrylic acid) based copolymers, polydiene based copolymers, hydrogenated diene based copolymers, poly(ethylene oxide) based copolymers, polyisobutylene based copolymers, polystyrene based copolymers, polyisopropylacrylamide based copolymers, poly(2-vinyl naphthalene) based copolymers, poly(vinyl pyrrolidone) based copolymers, acid cleavable copolymers, UV cleavable polymers, and combinations thereof; ABA triblock copolymers including but not limited to poly((meth)acrylate) based triblock copolymers, polybutadiene based triblock copolymers, poly(oxirane) based triblock copolymers, polylactone and polyactide triblock copolymers, polyoxazoline based triblock copolymers, polystyrene based triblock copolymers, poly(vinyl pyridine) based triblock copolymers, and combinations thereof; ABC triblock copolymers including but not limited to ABC triblock copolymers with polystyrene as the first block; and combinations thereof.

Poly(meth)acrylate based diblock copolymers are exemplified by poly(methyl methacrylate-b-acrylonitrile); poly (methyl methacrylate-b-AzoMA) (AzoMA=11-[4-(4-butylphenylazo)phenoxy]undecylmethacrylate); poly(methyl methacrylate-b-disperse red 1 acrylate); poly(methyl methacrylate isotactic-b-methyl methacrylate syndiotactic); poly (methyl methacrylate-b-neopentyl acrylate); ppoly(methyl methacrylate-b-n-nonyl acrylate); poly(methyl methacrylate-b-n-octyl acrylate); poly(methyl methacrylate-b-t-butyl acrylate); poly(methyl methacrylate-b-t-butyl methacrylate); poly(methyl methacrylate-b-trifluoroethyl methacrylate); poly(methyl methacrylate-b-2-(bromoisobutryl ethylmethacrylate); poly(methyl methacrylate-b-2-hydroxyethyl methacrylate); poly(methyl methacrylate-co-n-butyl methacrylate random-b-2-hydroxyethyl methacrylate); poly(methyl methacrylate-b-2-hydroxyethyl methacrylate with cholesteryl chloroformate); poly(methyl methacrylate-b-6-(4-cyanobiphenyl-4-yloxy)hexyl methacrylate); poly (methacrylate-b-2-pyranoxy ethyl methacrylate); poly(1-adamantyl methacrylate-b-methyl methacrylate); poly(1-adamantyl methacrylate-b-ethyl methacrylate); poly(1-adamantyl methacrylate-b-2-hydroxyethyl methacrylate); poly(1-adamantyl methacrylate-b-n-butyl methacrylate); poly(1-Adamantyl methacrylate-b-t-butyl acrylate); poly(1-Adamantyl methacrylate-b-lactide (DL-form)); poly(n-butyl acrylate-b-methyl methacrylate); poly(t-butyl acrylate-b-4-vinylpyridine); poly(t-butyl acrylate-b-methyl methacrylate); poly(t-butyl methacrylate-b-2-vinyl pyridine); poly(t-butyl methacrylate-b-4-vinyl pyridine); poly(t-butyl methacrylate-b-lauryl methacrylate); poly(2-ethyl hexyl acrylate-b-4-vinyl pyridine); poly(2-hydroxylethyl acrylate-b-neopentyl acrylate); poly(n-butyl methacrylate-b-2-hydroxyethylmethacrylate); poly(n-butyl methacrylate-b-glycidyl methacrylate); poly(n-butyl methacrylate-b-glycidyl methacrylate-co-hydroxypropyl methacrylate sodium salt); poly(2-hydroxylethyl methacrylate-b-neopentyl methacrylate); poly(2-hydroxylethyl methacrylate-b-t-butyl methacrylate); poly(ethyl propyl acrylate-b-methyl methacrylate); poly(neopentyl methacrylate-b-t-butyl methacrylate); and combinations thereof.

Poly diene based diblock copolymers are exemplified by poly(butadiene(1,2 addition)-b-t-butyl acrylate; poly(butadiene(1,4 addition)-b-t-butyl acrylate; poly(butadiene(1,2 addition)-b-1-butyl methacrylate); poly(butadiene(1,2 addition)-b-methyl methacrylate); poly(butadiene(1,4 addition)-b-methyl methacrylate) (syndiotactic); poly(butadiene(1,2 addition)-b-s-butyl methacrylate); poly(butadiene(1,2 addition)-b-t-butyl methacrylate); poly(butadiene(1,4 addition)-b-ε-caprolactone); poly(butadiene(1,2 addition)-b-lactide); poly(butadiene(1,4 addition)-b-lactide); poly(butadiene(1,4 addition)-b-4-vinyl pyridine; poly(isoprene(1,2 addition)-b-4-vinyl pyridine); poly(isoprene(1,4 addition)-b-4-vinyl pyridine); poly(isoprene(1,4 addition)-b-2-vinyl pyridine; poly(isoprene(1,4 addition)-b-methyl methacrylate(syndiotactic)); and combinations thereof.

Poly isobutylene based diblock copolymers are exemplified by poly(isobutylene-b-t-butyl acrylate); poly(isobutylene-b-t-butyl methacrylate); poly(isobutylene-b-methyl methacrylate); poly(isobutylene-b-ε-caprolactone); poly (isobutylene-b-4-vinyl pyridine); and combinations thereof.

Polystyrene based diblock copolymers are exemplified by poly(styrene-b-AzoMA) (AzoMA=11-[4-(4-butylphenylazo)phenoxy]undecylmethacrylate); poly(styrene-b-benzyl propylacrylate); poly(styrene-b-bipyridylmethyl acrylate); poly(styrene-b-butadiene(1,2 addition)); poly(styrene-b-butadiene(1,4 addition)); poly(styrene-b-cyclohexane) (polycyclohexane rich in 1,4 addition); poly(styrene-b-cyclohexadiene) (polycyclohexadiene rich in 1,4 addition); poly (styrene-b-cyclohexyl methacrylate); poly(styrene-b-disperse red 1 acrylate); poly(styrene-b-ethyl methacrylate); poly(styrene-b-isoprene(1,2 addition or 3,4 addition)); poly (styrene-b-isoprene(1,4 addition)); poly(styrene-b-methylbutylene (from hydrogenation of S-b-IP); poly(styrene-b-lactide); poly(styrene-b-methyl methacrylate) PMMA syndiotactic rich contents>80%; poly(styrene-b-methylmethacrylate) (PMMA isotactic rich Iso contents>95%); poly(styrene-b-methyl methacrylate) PMMA atactic rich contents; poly(styrene-b-1-adamantyl methacrylate); poly (styrene-b-N,N-dimethyl amino ethyl methacrylate); poly (styrene-b-n-butyl acrylate); poly(styrene-b-n-butyl methacrylate); poly(styrene-b-nonyl methacrylate); poly(styrene-b-n-hexyl methacrylate); poly(styrene-b-n-propyl methacrylate); poly(styrene-b-t-butoxystyrene); poly(styrene-b-t-butyl acrylate); poly(styrene-b-t-butyl acrylate), Broad Distribution; poly(styrene-b-t-butyl methacrylate); poly(styrene-b-propyl acrylic acid); poly(styrene-b-t-butyl styrene); poly(styrene-b-ε-caprolactone); poly(styrene-b-2-cholesteryloxycarbonyloxy ethyl methacrylate); poly(styrene-b-2-hydroxyethyl methacrylate); poly(styrene-b-2-hydroxypropyl methacrylate); poly(styrene-b-2-vinyl pyridine); poly(styrene-b-4-hydroxyl styrene); poly(styrene-b-4-methyoxy styrene); poly(styrene-b-4-vinyl pyridine); poly(styrene-b-nonyl methacrylate-co-methacrylic acid); poly(α-methylstyrene-b-4-vinyl pyridine); poly(4-aminomethyl styrene-b-styrene); poly(4-methyoxy styrene-b-ethyl methacrylate); poly(4-methyoxy styrene-b-t-butyl acrylate); poly(p-chloromethyl styrene-b-t-butyl acrylate); tapered block copolymer poly(styrene-b-butadiene); tapered block copolymer poly(styrene-b-ethylene); poly(styrene-b-Nylon-6); and combinations thereof.

Poly vinyl naphthalene based diblock copolymers are exemplified by poly(2-vinyl naphthalene-b-methyl methacrylate); poly(2-vinyl naphthalene-b-n-butyl acrylate); poly(2-vinyl naphthalene-b-t-butyl acrylate); and combinations thereof.

Poly vinyl pyridine based diblock copolymers are exemplified by poly(2-vinyl pyridine-b-methyl methacrylate); poly(4-vinyl pyridine-b-methyl methacrylate); poly(2-vinyl pyridine-b-t-butyl methacrylate); poly(2-vinyl pyridine-b-methyl acrylic acid); poly(2-vinyl pyridine-b-$\epsilon$-caprolactone); and combinations thereof.

Poly propylene oxide based diblock copolymers are exemplified by poly(propylene oxide-b-$\epsilon$-caprolactone).

Adipic anhydride based diblock copolymers are exemplified by poly(ethylene oxide-b-adipic anhydride); poly(methyl methacrylate-b-adipic anhydride); poly(propylene oxide-b-adipic anhydride); poly(2-vinyl pyridine-b-adipic anhydride); and combinations thereof.

Poly olefin based diblock copolymers are exemplified by poly(ethylene-b-methyl methacrylate); poly(ethylene-b-4-vinyl pyridine); and combinations thereof.

Poly lactone or polylactide based diblock copolymers are exemplified by poly($\epsilon$-caprolactone-b-lactide).

Amphiphilic block copolymers are exemplified by poly((meth)acrylic acid) based amphiphilic block copolymers; polybutadiene based amphiphilic block copolymers; hydrogenated diene based amphiphilic block copolymers; poly(ethylene oxide) based amphiphilic block copolymers, polyisobutylene based amphiphilic block copolymers, polystyrene based based amphiphilic block copolymers, polyisopropylacrylamide based amphiphilic block copolymers, poly(2-vinyl naphthalene) based amphiphilic block copolymers; poly(vinylpyrrolidone) based amphiphilic block copolymers, acid cleavable amphiphilic block copolymers; UV cleavable amphiphilic block copolymers, and combinations thereof.

Poly((meth)acrylic acid) based amphiphilic block copolymers are exemplified by poly(acrylic acid-b-acrylamide); poly(acrylic acid-b-methyl methacrylate); poly(acrylic acid-b-N-isopropylacrylamide); poly(n-butylacrylate-b-acrylic acid); poly(sodium acrylate-b-methyl methacrylate); poly(methacrylic acid-b-neopentyl methacrylate); poly(methyl methacrylate-b-acrylic acid); poly(methyl methacrylate-b-methacrylic acid); poly(methyl methacrylate-b-N,N-dimethyl acrylamide); poly(methyl methacrylate-b-sodium acrylate); poly(methyl methacrylate-b-sodium methacrylate); poly(neopentyl methacrylate-b-methacrylic acid); poly(t-butyl methacrylate-b-ethylene oxide); poly(2-acrylamido-2-methylpropanesulfonic acid-b-acrylic acid); and combinations thereof.

Polydiene based amphiphilic block copolymers are exemplified by poly(butadiene(1,2 addition)-b-ethylene oxide); poly(butadiene(1,2 addition)-b-methylacrylic acid; poly(butadiene(1,4 addition)-b-acrylic acid); poly(butadiene(1,4 addition)-b-ethylene oxide; poly(butadiene(1,4 addition)-b-sodium acrylate); poly(butadiene(1,4 addition)-b-N-methyl 4-vinyl pyridinium iodide); poly(isoprene-b-ethylene oxide) (1,2 and 3,4-addition); poly(isoprene-b-ethylene oxide) (1.4 addition); poly(isoprene-b-N-methyl 2-vinyl pyridinium iodide); 4-hydroxy benzoic ester terminated poly(butadiene (1,2 addition)-b-ethylene oxide); 4-methoxy benzyolester terminated poly(butadiene(1,2 addition)-b-ethylene oxide) diblock copolymer; and combinations thereof.

Hydrogentated diene based amphiphilic block copolymers are exemplified by poly(ethylene-b-ethylene oxide) (hydrogenated poly(1,4-butadiene)); poly[(ethylene-co-butene)-b-ethylene oxide] (hydrogenated poly(1,2-butadiene)); poly [(propylene-co-ethylene-b-ethylene oxide)]{hydrogenated poly(isoprene-b-ethylene oxide) (1,4-addition)}; hydrogonated poly(isoprene-b-ethylene oxide) (1,2-addition); and combinations thereof.

Poly(ethylene oxide) based amphiphilic block copolymers are exemplified by poly(ethylene oxide-b-acrylic acid); poly(ethylene oxide-b-acrylamide); poly(ethylene oxide-b-butylene oxide); poly(ethylene oxide-b-$\epsilon$-caprolactone); poly(ethylene oxide-b-lactide); poly(ethylene oxide-b-lactide) (DL form) ($\alpha$-hydroxy-$\omega$-acetal terminated); poly(ethylene oxide-b-methacrylic acid); poly(ethylene oxide-b-methyl acrylate); poly(ethylene oxide-b-N-isopropylacrylamide); poly(ethylene oxide-b-methyl methacrylate); poly(ethylene oxide-b-nitrobenzyl methacrylate); poly(ethylene oxide-b-N,N-dimethylaminoethylmethacrylate); poly(ethylene oxide-b-propylene oxide); poly(ethylene oxide-b-t-butyl acrylate); poly(ethylene oxide-b-t-butyl methacrylate); poly(ethylene oxide-b-tetrahydrofurfuryl methacrylate); poly(ethylene oxide-b-2-ethyl oxazoline); poly(ethylene oxide-b-2-hydroxyethyl methacrylate); poly(ethylene oxide-b-2-methyl oxazoline); poly[ethylene oxide-b-(methyl methacrylate-co-N,N-dimethylaminoethylmethacrylate)]; poly(ethylene oxide-b-4-vinyl pyridine) PEO end functional methoxy; poly(ethylene oxide-b-6-(4'-cyanobiphenyl-4-yloxy)hexyl methacrylate); poly(ethylene oxide-b-11-[4-(4-butylphenylazo)phenoxy]-undecyl methacrylate); and combinations thereof.

Polyisobutylene based amphiphilic block copolymers are exemplified by poly(isobutylene-b-acrylic acid); poly(isobutylene-b-ethylene oxide); poly(isobutylene-b-methacrylic acid); and combinations thereof.

Polystyrene based amphiphilic block copolymers are exemplified by poly(styrene-b-acrylamide); poly(styrene-b-acrylic acid); poly(styrene-b-cesium acrylate); poly(styrene-b-ethylene oxide); poly(styrene-b-ethylene oxide) Acid cleavable at the block junction; poly(styrene-b-methacrylic acid); poly(4-styrenesulfonic acid-b-ethylene oxide); poly(styrenesulfonic acid-b-methylbutylene); poly(styrene-b-N,N-dimethylacrylamide); poly(styrene-b-N-isopropyl acrylamide); poly(styrene-b-N-methyl 2-vinyl pyridinium iodide); poly(styrene-b-N-methyl-4-vinyl pyridinium iodide); poly(styrene-b-propylacrylic acid); poly(styrene-b-sodium acrylate); poly(styrene-b-sodium methacrylate); poly(p-chloromethyl styrene-b-acrylamide); poly(styrene-co-p-chloromethyl styrene-b-acrylamide); poly(styrene-co-p-chloromethyl styrene-b-acrylic acid); poly(styrene-b-methylbutylene-co-isoprene sulfonate); and combinations thereof.

Polyisopropylacrylamide based amphiphilic block copolymers are exemplified by poly(N-isoprylacrylamide-b-ethylene oxide).

Poly(2-vinyl naphthalene) based amphiphilic block copolymers are exemplified by poly(2-vinyl naphthalene-b-acrylic acid).

Poly(vinyl pyrrolidone) based amphiphilic block copolymers are exemplified by poly(vinyl pyrrolidone-b-D/L-lactide).

Acid cleavable based amphiphilic block copolymers are exemplified by poly(ethylene oxide-b-methyl methacrylate) acid cleavable at the block junction; poly(ethylene oxide-b-1'-[4-(4-butylphenylazo)phenoxy]-undecyl methacrylate) acid cleavable at the block junction; poly(ethylene oxide-b-t-butyl methacrylate) acid cleavable at the block junction;

poly(ethylene oxide-b-styrene) acid cleavable at the block junction; poly(styrene-b-ethylene oxide) acid cleavable at the block junction; poly(ethylene oxide-b-4-cyano biphenyl hexyl methacrylate) acid cleavable at the block junction; and combinations thereof.

UV cleavable based amphiphilic block copolymers are exemplified by poly(ethylene oxide-b-n-butyl methacrylate) UV cleavable at the block junction; poly(ethylene oxide-b-methyl methacrylate) UV cleavable at the block junction; poly(ethylene oxide-b-styrene) UV cleavable at the block junction; poly(ethylene oxide-b-tetrohydrofurfuryl methacrylte) UV cleavable at the block junction; and combinations thereof.

ABA triblock copolymers include poly((meth)acrylate) based triblock copolymers, polybutadiene based triblock copolymers, poly(oxirane) based triblock copolymers, polylactone and polylactide based triblock copolymers, polyoxazoline based triblock copolymers, polystyrene based triblock copolymers, poly(vinyl pyridine) based triblock copolymers, and combinations thereof.

Poly((meth)acrylate) based triblock copolymers are exemplified by poly(n-butyl acrylate-b-9,9-di-n-hexyl-2,7-fluorene-b-n-butyl acrylate); poly(t-butyl acrylate-b-9,9-di-n-hexyl-2,7-fluorene-b-t-butyl acrylate); poly(acrylic acid-b-9,9-di-n-hexyl-2,7-fluorene-b-acrylic acid); poly(t-butyl acrylate-b-methyl methacrylate-b-t-butyl acrylate); poly(t-butyl acrylate-b-styrene-b-t-butyl acrylate); poly(methyl methacrylate-b-butadiene(1,4 addition)-b-methyl methacrylate); poly(methyl methacrylate-b-n-butyl acrylate-b-methyl methacrylate); poly(methyl methacrylate-b-t-butyl acrylate-b-methyl methacrylate); poly(methyl methacrylate-b-t-butyl methacrylate-b-methyl methacrylate); poly(methyl methacrylate-b-methacrylic acid-b-methyl methacrylate); poly (methyl methacrylate-b-9,9-di-n-hexyl-2,7-fluorene-b-methyl methacrylate); poly(methyl methacrylate-b-styrene-b-methyl methacrylate); poly(N,N-dimethyl amino ethyl methacrylate-b-9,9-di-n-hexyl-2,7-fluorene-b-N,N-dimethyl amino ethyl methacrylate); poly(N,N-dimethyl amino ethyl methacrylate-b-ethylene oxide-b-N,N-dimethyl amino ethyl methacrylate); poly(N,N-dimethyl amino ethyl methacrylate-b-propylene oxide-b-N,N-dimethyl amino ethyl methacrylate); poly(t-butyl methacrylate-b-methyl methacrylate-b-t-butyl methacrylate); poly(methyl methacrylate-b-ϵ-caprolactone-b-methyl methacrylate); and combinations thereof.

Polybutadiene based triblock copolymers are exemplified by poly(butadiene(1,4 addition)-b-styrene-b-butadiene(1,4 addition)).

Poly(oxirane) based triblock copolymers are exemplified by poly(ethylene oxide-b-9,9-di-n-hexyl-2,7-fluorene-b-ethylene oxide); poly(ethylene oxide-b-propylene oxide-b-ethylene oxide); poly(ethylene oxide-b-styrene-b-ethylene oxide); poly(ethylene oxide-b-lactide-b-ethylene oxide); poly(ethylene oxide-b-butadiene-b-ethylene oxide) (PBd 1,2 microstr); and combinations thereof.

Polylactone and polylactide based triblock copolymers are exemplified by poly(lactide-b-ethylene oxide-b-lactide); poly(lactide-b-ϵ-caprolactone-b-lactide) (L-form lactide); poly[lactide(DL)-co-glycolide-b-ethylene oxide-b-lactide (DL)-c-glycolide]; poly(lactide-b-3-hexyl thiophene-b-lactide D/L form); poly(caprolactone-b-ethylene oxide-b-caprolactone); α-ω-diacrylonyl terminated poly(lactide-b-ethylene oxide-b-lactide); and combinations thereof.

Polyoxazoline based triblock copolymers are exemplified by poly(2-methyl oxazoline-b-ethylene oxide-b-2-methyl oxazoline); poly(2-ethyl oxazoline-b-ethylene oxide-b-2-ethyl oxazoline); and combinations thereof.

Polystyrene based triblock copolymers are exemplified by poly(styrene-b-acrylic acid-b-styrene); poly(styrene-b-butadiene (1,4 addition)-b-styrene); poly(styrene-b-butadiene (1,2 addition)-b-styrene); poly(styrene-b-Ethylene-butylene-b-styrene); poly(styrene-b-n-butyl acrylate-b-styrene); poly (styrene-b-t-butyl acrylate-b-styrene); poly(styrene-b-t-butyl methacrylate-b-styrene); poly(styrene-b-9,9-di-n-hexyl-2,7-fluorene-b-styrene); poly(styrene-b-ethyl acrylate-b-styrene); poly(styrene-b-methyl methacrylate-b-styrene); poly (styrene-b-isoprene(1,4 rich addition)-b-styrene); poly (styrene-b-ethylene oxide-b-styrene); poly(styrene-b-4-vinyl pyridine-b-styrene); poly(styrene-b-ϵ-caprolactone-b-styrene); and combinations thereof.

Poly(vinyl pyridine) based triblock copolymers are exemplified by poly(2-vinyl pyridine-b-butadiene(1,2 addition)-b-2-vinyl pyridine); poly(2-vinyl pyridine-b-styrene-b-2-vinyl pyridine); poly(4-vinyl pyridine-b-styrene-b-4-vinyl pyridine); and combinations thereof.

ABC triblock copolymers with polystyrene as first block are exemplified by poly(styrene-b-butadiene-b-methyl methacrylate) pBd rich in 1,4 addition; poly(styrene-b-butadiene-b-2-vinyl pyridine); poly(styrene-b-t-butyl acrylate-b-methyl methacrylate); poly(styrene-b-isoprene-b-glycidyl methacrylate); poly(styrene-b-isoprene-b-methyl methacrylate); poly(styrene-b-isoprene-b-2-vinyl pyridine); poly(styrene-b-2-vinyl pyridine-b-ethylene oxide); poly(styrene-b-anthracene methyl methacrylate-b-methymethacrylate); poly (styrene-b-t-butyl acrylate-b-2-vinyl pyridine); poly(styrene-b-t-butyl methacrylate-b-2-vinyl pyridine); poly(styrene-b-2-vinyl pyridine-b-t-butyl methacrylate); poly(styrene-b-4-vinyl pyridine-b-ethylene oxide); poly(styrene-b-butadiene-b-methyl methacrylate) PBd rich in 1,2 addition; and combinations thereof. Other ABC triblock copolymers useful in the method descrbied herein are exemplified by poly(isoprene[1,4-addition]-b-styrene-b-2-vinyl pyridine); poly(isoprene[1,4-addition]-b-styrene-b-ethylene oxide); and combinations thereof.

All of these organic block copolymers are commercially available from Polymer Source, Inc. of Montreal, Quebec, Canada.

Silicone Organic Block Copolymer

The silicone organic block copolymer useful herein may have siloxane blocks that are relatively compatible with the MQ resin, and the silicone organic block copolymer may have blocks that are relatively incompatible with the MQ resin. In general, the molecular weights of the blocks in the silicone organic block copolymer should sufficient to permit the silicone organic block copolymer to phase segregate. The exact value for these molecular weights will vary depending on the type of silicone organic block copolymer, however, the lower limit may be 1,000 for each block.

The silicone organic block copolymer may have a formula selected from: $E-(D_a-X_b)_c-E$, $E-(D_d-X_e-D_f)_g-E$, $E-(X_h-D_i-Xp_k)-E$, and a combination thereof; where each E is an end-blocking group, each D is a difunctional siloxane unit, each X is an organic group, e.g., a group incompatible with the siloxane block D, subscript a has a value of at least 2, subscript b has a value of at least 2, subscript c has a value of at least 1, subscript d has a value of at least 2, subscript e has a value of at least 2, subscript f has a value of at least 2, subscript g has a value of at least 1, subscript h has a value of at least 2, subscript i has a value of at least 2, subscript j has a value of at least 2, and subscript k has a value of at least 1. Subscripts a, b, d, e, f, g, h, i, and j are such that the each block has a number average molecular weight of at least 1,000. The volume fraction of D units (volume of D units/volume of the entire block copolymer) may range from 0.01 to 0.6, alternatively 0.1 to 0.5, alternatively 0.2 to 0.4, and alternatively 0.25 to 0.35. Subscripts a-k each have a value to satisfy the volume fraction limitation of the D units.

Each D in the formulae above represents a difunctional siloxane unit of formula ($R^1_2SiO_{2/2}$). Each $R^1$ may be a hydrocarbon group or a halogenated hydrocarbon group. Suitable hydrocarbon groups for $R^1$ include an alkyl group, a cycloalkyl group, an alkenyl group, an alkynyl group, or an aryl group. Suitable alkyl groups are exemplified by methyl, ethyl, propyl, pentyl, octyl, undecyl, and octadecyl groups. Suitable cycloalkyl groups are exemplified by cyclopentyl and cyclohexyl groups. Suitable alkenyl groups are exemplified by vinyl, allyl, butenyl, and hexenyl. Suitable alkynyl groups are exemplified by ethynyl, propynyl, and butynyl groups. Suitable aryl groups are exemplified by phenyl, tolyl, xylyl, benzyl, and 2-phenylethyl. Alternatively, each $R^1$ may be selected from alkyl groups and aryl groups. Alternatively, each $R^1$ may be a methyl group or a phenyl group. Alternatively, each $R^1$ may be a methyl group. Alternatively, some or all $R^1$ groups may be a halogenated hydrocarbon group. Suitable halogenated hydrocarbon groups include, but are not limited to chloromethyl, chloropropyl, trifluoropropyl, heptadecafluorodecyl, heptafluoropentyl, nonafluorohexyl, octafluoropentyl, pentafluorobutyl, tetrafluopropyl, trifluoroethyl, and trifluoropropyl. Alternatively, each D may be independently selected from $Me_2SiO_{2/2}$ units, $PhMeSiO_{2/2}$ units, and $Ph_2SiO_{2/2}$ units, where Me represents a methyl group and Ph represents a phenyl group.

Each X in the copolymer is a group incompatible with the D unit. Each X may be an organic group. Each X may be independently selected from adipic anhydride, butyl acrylate, butyl methylacrylate, caprolactone, (cyanobiphenylyloxy) hexyl methacrylate, ethoxy ethyl methacrylate, ethylene oxide, hydroxy ethyl acrylate, isobutylene, lactide, methyl methacrylate, propylene oxide, styrene, vinyl naphthalene, and vinyl pyridine. Alternatively, each X may be independently selected from butyl acrylate, caprolactone, isobutylene, methyl methacrylate, propylene oxide, styrene, and vinyl naphthalene. Alternatively, each X may be free of nitrogen atoms. Alternatively, each X may be may be independently selected from butyl acrylate, caprolactone, isobutylene, methyl methacrylate, propylene oxide, and vinyl naphthalene. Alternatively, X may be a siloxane block incompatible with a D block. For example, when D is a dimethylsiloxane block, X may be a diphenylsiloxane block or a phenylmethylsiloxane block.

Each E represents and endblocking group. Each E may be independently selected from silanol groups, $Me_3SiO_{1/2}$ units, $Ph_2MeSiO_{1/2}$ units, and $PhMe_2SiO_{1/2}$ units, where Me represents a methyl group and Ph represents a phenyl group. Alternatively, each E may be independently selected from $Me_3SiO_{1/2}$ units and $PhMe_2SiO_{1/2}$ units. In one embodiment, each E may be a $Me_3SiO_{1/2}$ unit, each D may be a $Me_2SiO_{2/2}$ unit, and each X may be styrene.

Many different silicone organic block copolymers e.g., such as polybutadiene-polydimethylsiloxane, polyisobutylene-polydimethoxysiloxane (PIB/PDMS), polystyrene-polydimethoxysiloxane (PS/PDMS), polymethylmethacrylate-polydimethoxysiloxane (PMMA/PDMS), could be used for the methods described herein. Suitable silicone organic block copolymers are known in the art and are commercially available, for example, from Polymer Source, Inc. of Montreal, Quebec, Canada.

Such suitable silicone organic block copolymers include AB type block copolymers such as poly(n-butyl acrylate-b-dimethylsiloxane-co-diphenyl siloxane), poly(styrene-b-methyl phenyl siloxane), poly(2-vinyl naphthalene-b-dimethylsiloxane), poly(2-vinyl pyridine-b-dimethylsiloxane), poly (4-vinyl pyridine-b-dimethylsiloxane), poly (dimethylsiloxane-b-n-butyl acrylate), poly (dimethylsiloxane-b-t-butyl acrylate), poly (dimethylsiloxane-b-hydroxy ethyl acrylate), poly (dimethylsiloxane-b-methyl methacrylate), poly(styrene-dimethylsiloxane), poly(styrene-b-dimethylsiloxane), silanol endgroup, poly(styrene-b-dimethylsiloxane), trimethylsiloxy endgroup, poly(dimethylsiloxane-b-methyl methacrylate-co-t-butyl methylacrylate), poly(dimethylsiloxane-b-t-butyl methacrylate), poly(dimethylsiloxane-b-1-ethoxy ethyl methacrylate), poly(dimethylsiloxane-b-6-(4'-cyanobiphenyl-4-yloxy)hexyl methacrylate), poly(dimethylsiloxane-b-ε-caprolactone), poly(dimethylsiloxane-b-lactide), poly(ethylene oxide-b-dimethyl siloxane), poly(dimethyl siloxane-b-adipic anhydride), and poly(isobutylene-b-dimethylsiloxane). These copolymers are commercially available from Polymer Source, Inc. of Montreal, Quebec, Canada.

Suitable silicone organic block copolymers include ABA type block copolymers such as poly(methyl methacrylate-b-dimethylsiloxane-b-methyl methacrylate), poly(ethylene oxide-b-dimethyl siloxane-b-ethylene oxide), poly(styrene-b-dimethyl siloxane-b-styrene), poly(ethylene oxide)-b-poly (dimethylsiloxane)-b-poly(ethylene oxide), poly(dimethyl siloxane-b-ethylene oxide-b-dimethylsiloxane) (terminal end silanol), poly(dimethyl siloxane-b-ethylene oxide-b-dimethylsiloxane) (terminal end trimethylsilane), poly(2-ethyl oxazoline-b-dimethyl siloxane-b-2-ethyl oxazoline), poly(2-ethyl oxazoline-b-dimethyl siloxane-b-2-ethyl oxazoline) End functionalized with acrylate, poly(2-ethyl oxazoline-b-dimethyl siloxane-b-2-ethyl oxazoline) end functionalized with methacrylate, poly(2-methyl oxazoline-b-dimethyl siloxane-b-2-methyl oxazoline), poly(2-methyl oxazoline-b-dimethyl siloxane-b-2-methyl oxazoline), end functionalized with methacrylate, and poly(2-methyl oxazoline-b-dimethyl siloxane-b-2-methyl oxazoline), end functionalized with acrylate, poly(propylene oxide-b-dimethyl siloxane-b-propylene oxide), poly(butadiene((1,4 addition)-b-dimethylsiloxane), and combinations thereof. These copolymers are also commercially available from Polymer Source, Inc.

Solvent

The solvent is an optional ingredient that may be used in the method described herein. The solvent may be any solvent capable of dissolving the MQ resin and the block copolymer. Suitable solvents include organic solvents such as toluene, xylene, chloroform, butanone, acetone, and diacetone alcohol.

The Combination of Ingredients A) and B) may be free of homopolymers, such as trimethylsiloxy-terminated polydimethylsiloxane homopolymer. Free of homopolymers means that the amount of polymers other than ingredients A) and B) present in the Combination of Ingredients A) and B) is sufficiently low that any polymers other than ingredients A) and B) do not significantly affect the structured morphology formed by the Combination of Ingredients A) and B).

Method

A method for modifying morphology of a block copolymer comprises:
1) combining ingredients comprising
    A) a tri-functional silicate nanoparticle;
    B) a block copolymer comprising a compatible unit and an incompatible unit, where ingredient B) has capability to form a structured morphology in the absence of ingredient A);
    optionally C) a solvent;
optionally 2) removing the solvent, thereby forming a Combination of Ingredients A) and B) having an amorphous morphology; and 3) annealing, thereby forming a Combination of Ingredients A) and B) having a different structured morphology from the structured morphology of ingredient B). The volume of ingredient A) plus the compatible units of ingredient B) divided by the total volume of ingredients A) and B) combined determines the morphology; this value depends on various factors including the type and polydispersity of the block copolymer selected for ingredient B) and the polydispersity of ingredient A), however, this value may range from 1 vol % to 99 vol %, alternatively 10 vol % to 70 vol %, alternatively 30 vol % to 70 vol %, and alternatively 10 vol % to 50 vol %. Alternatively, the amount of MQ resin may range from 5 vol % to 30 vol % based on the total volume of ingredients A) and B) combined.

Alternatively, a silicone organic block copolymer may be used as ingredient (B). In this embodiment, the method may comprise
1) combining ingredients comprising
    A) a tri-functional silicate nanoparticle,
    B) a silicone organic block copolymer comprising a difunctional siloxane unit and an incompatible unit, where ingredient B) has capability to form a structured morphology in the absence of ingredient A);
    optionally C) a solvent;
optionally 2) removing the solvent, thereby forming a Combination of Ingredients A) and B) having an amorphous morphology, and
3) annealing, thereby forming a Combination of Ingredients A) and B) having a different structured morphology from the structured morphology of ingredient B). The sum of amount of ingredient A) plus the D units of ingredient B) divided by the total volume of the Combination of Ingredients A) and B) may range from 1 vol % to 99 vol %, alternatively 10 vol % to 70 vol %, alternatively 30 vol % to 70 vol %, and alternatively 10 vol % to 50 vol %. Alternatively, the amount of MQ resin may range from 5 vol % to 30 vol % based on the total volume of ingredients A) and B) combined.

The Combination of Ingredients A) and B) formed during step 1) (or step 2), when present) may comprise a physical mixture of ingredients A) and B). Alternatively, the Combination of Ingredients A) and B) may comprise a reaction product of ingredients A) and B). After annealing, the Combination of Ingredients A) and B) has a different structured morphology than the structured morphology of ingredient B). For example, a block copolymer may have cylindrical morphology, and the Combination of Ingredients A) and B) made using the block copolymer as ingredient B) in this method may have a gyroid morphology or a lamellar morphology. Alternatively, a Combination of Ingredients A) and B) made with the method described herein may have a cylindrical morphology. For purposes of this application, "different structured morphology" includes morphologies where the phase size differs, e.g., the copolymer selected for ingredient B) would form relatively thin cylinders and the Combination of Ingredients A) and B) forms relatively fat cylinders.

Step 1) Combining

Combining ingredients comprising A) and B) may be performed by dissolving or dispersing ingredients A) and B) in ingredient C). Alternatively, ingredient A) may be dissolved or dispersed in ingredient C) to form a solution or dispersion before adding ingredient B). Alternatively, combining ingredients comprising A) and B) may be performed by melt processing. A solvent is not required for melt processing. Combining the ingredients in the method described herein may be performed by any convenient means, such as mixing.

Step 2) Removing Solvent

Solvent may be removed by any convenient means such as allowing the solvent to evaporate. Solvent removal may be facilitated by heating and/or reducing pressure. Solvent removal may be performed before annealing. Alternatively, solvent removal may be performed during annealing as part of the annealing step.

Step 3) Annealing

Annealing may be performed by any means that allows the Combination of Ingredients A) and B) to form a structured morphology. Annealing may be performed by heating the Combination of Ingredients A) and B) at a temperature and for a time sufficient for the Combination of Ingredients A) and B) to self-assemble into domains having a structured morphology. The Combination of Ingredients A) and B) may be placed in a temperature chamber and thermally annealed by heating above glass transition temperatures of the ingredients in the Combination of Ingredients A) and B). The annealing temperature should be below the order/disorder transition temperature of the Combination of Ingredients A) and B), which will depend on the phase diagram for the Combination of Ingredients A) and B) and below the temperature at which ingredient A) and/or ingredient B) degrades. Such degradation temperature will depend on the specific ingredients selected for ingredients A) and B). The exact conditions for annealing depend on various factors including the type and amount of each of block in the copolymer, the type and amount of silicate, whether solvent is present in the annealing step, and the temperature selected for annealing. (This is because copolymer mobility may increase with increasing temperature, and other factors, such as the difference in surface energy of the blocks, which are also temperature dependent.) However, annealing time may range from 1 second to 50 hours, alternatively 1 second to 25 hours, alternatively 1 second to 3 hours, alternatively 3 hours to 25 hours. Annealing time depends on various factors including annealing temperature. Generally, annealing time will shorten as annealing temperature increases. Annealing may be performed at room temperature (25° C.). The upper limit for annealing temperature may depend various factors including on the degradation temperature and the order/disorder transition temperature for the particular MQ resin selected for ingredient A) and the selection of copolymer for ingredient B). Alternatively, annealing temperature may be at least 50° C. Alternatively, annealing temperature may be less the degradation temperature of the copolymer, the silicate, or the substrate. Alternatively, annealing temperature may be up to 280° C., alternatively 250° C., alternatively 190° C., and alternatively 170° C. Alternatively, annealing temperature may range from 100° C. to 200° C. Alternatively, annealing may be performed by heating at a temperature ranging from 50° C. to 280° C. for a time ranging from 1 second to 3 hours. Alternatively, annealing may be performed under vacuum. Without wishing to be bound by theory, it is thought that annealing under vacuum can minimize degradation of ingredient A) and/or ingredient B) by reducing oxidation.

Alternatively, annealing may include a method selected from applying shear to the combination, compression deformation of the Combination of Ingredients A) and B), roll casting the Combination of Ingredients A) and B), applying a temperature gradient to the Combination of Ingredients A) and B), applying an electric field to the Combination of Ingredients A) and B), confining the Combination of Ingredients A) and B) between surfaces, applying the Combination of Ingredients A) and B) to a surface of a fluid, applying a solvent to a surface of a substrate before applying the Combination of Ingredients A) and B) to the surface, performing a top down lithography technique on the surface of the substrate before applying the Combination of Ingredients A) and B) to the surface, applying epitaxial control to the Combination of Ingredients A) and B), and applying graphoepitaxial control to the Combination of Ingredients A) and B), and/or controlling evaporation rate of the solvent. Such a method may be performed in addition to, or instead of, the annealing step employing heating and/or solvent removal, described above.

The product of the annealing step may have a desired structural morphology. The desired morphology depends on various factors including the structured morphology of ingredient B) in the absence of ingredient A) and the amount of MQ resin in the Combination of Ingredients A) and B). The structured morphology of the product of the annealing step may be selected from spherical, cylindrical, gyroid, double diamond, or lamellar.

Without wishing to be bound by theory, it is thought that the orientation of the structured morphology may be changed, depending on the annealing technique selected. For example, the structured morphology may be oriented in a direction relative to a substrate. For example, for a thin film formed from a Combination of Ingredients A) and B) with a cylindrical morphology, the cylinders may be oriented parallel to a substrate, or the cylinders may be oriented perpendicular to a substrate. One or more annealing techniques may be used to form the structured morphology and orient the structured morphology relative to the substrate.

Applications

The methods and ingredients described herein may be used in various applications. For example, the method and the Combination of Ingredients A) and B) may be used as a "bottom up" lithography technique to replace "top down" lithography techniques.

Thin Films

The methods and ingredients described herein may be used to form thin films. For example, a method for forming a thin film comprises:
1) applying to a substrate a composition comprising
   A) a tri-functional silicate nanoparticle,
   B) a silicone-organic block copolymer comprising a difunctional siloxane unit and an organic unit, where ingredient B) has capability to form a structured morphology in the absence of ingredient A), and
   optionally C) a solvent;
optionally 2) removing the solvent; and
3) annealing, thereby forming a film on the substrate. The film comprises a Combination of Ingredients A) and B), where the Combination of Ingredients A) and B) has a structured morphology. This method may be used to form a nanopatterned structure or feature on the substrate.

Step 1)

The composition may be prepared by dissolving or dispersing ingredients A) and B) in ingredient C). Alternatively, ingredient A) may be dissolved or dispersed in ingredient C) to form a solution or dispersion before the introduction of ingredient B). When solvent is present, the composition may be applied to the substrate by any convenient means such as spin coating, dip coating, spray coating, flow coating, or screen printing. Alternatively, the composition may be applied to the substrate by melt processing. Solvent may or may not be present during melt processing.

The substrate useful in the method for forming thin films may be any convenient substrate on which a thin film is desired. For example, the substrate may be a semiconductor or a glass article, Alternatively, the substrate may be a fluid. The substrate may optionally be heated during step 1). The substrate may optionally be removed after step 3) to form a free standing film, for example, when a fluid is used as the substrate.

Steps 2) and 3) may be performed as described above.

Optional Steps

The methods described herein may optionally further comprise step 4), removing a block of the copolymer. The method for selective removal of one or more of the blocks depends on the type of the block to be removed and the block that will remain. However, one exemplary method for removing a block may comprise UV irradiation, etching, or a combination thereof. Etching may be performed, e.g., with an acid such as acetic acid or anhydrous HF or alternatively with plasma. UV irradiation and subsequent etching with acetic acid may degrade and remove polymethylmethacrylate (PMMA) blocks from a PDMS/PMMA block copolymer film. Alternatively, etching with anhydrous HF may remove the silicone blocks from a copolymer such as PS/PDMS block copolymer.

The thin films formed by the method described herein may be used in various applications, such as separation membranes, lithography applications, high-density storage media, nanoporous materials, nano-templates, separation media, or high surface area support for catalysts or sensors. Thin films prepared according to the method above may have a thickness of at least 1 nanometer (nm). Alternatively, thin films prepared according to this method may have a thickness ranging from 2 nm to 100 nm, alternatively 10 nm to 100 nm dimensions. These thin films may be useful as nanometer scale membranes, templates for fabrication of nano-objects such as metal, ceramic nanodots and wires, as 1-, 2- and 3D photonic crystals, and as nanopattern masks for fabrication of high density information storage media. These thin films may also be used in addition to, or instead of, the films formed by using block copolymers (without the silicate nanoparticle) as described in, for example, U.S. Pat. No. 7,045,851, which is hereby incorporated by reference. For example, the thin film prepared by the method described herein may be used instead of the floating gate layer formed from self assembly of the block copolymer in U.S. Pat. No. 7,045,851 for the purpose of making a field effect transistor. Alternatively, the method described herein may be used in a method to form a nanocolumnar airbridge as described in U.S. Pat. No. 7,037,744. The method and the Combination of Ingredients A) and B) described herein may be used in the nanometer scale patterning method, instead of the phase separated polymers, in U.S. Pat. No. 7,037,744. Alternatively, the method and the Combination of Ingredients A) and B) described herein may be used instead of the block copolymer in the sub-lithographic patterning process described in U.S. Patent Publication 2008/0193658. U.S. Pat. No. 7,045,851; U.S. Pat. No. 7,037,744; and U.S. Patent Publication 2008/0193658 are hereby incorporated by reference for the applications described therein.

Adhesives and Elastomers

An alternative method for using the ingredients described above comprises:
1) combining ingredients comprising
A) a tri-functional silicate nanoparticle,
B) a silicone-organic block copolymer having a formula selected from $E-(D_a-X_b)_c-E$, $E-(D_d-X_e-D_f)_g-E$, $E-(X_h-D_i-X_j)_k-E$, and a combination thereof; where
each E is an endblocking group,
each D is a difunctional siloxane unit of formula $(R^1{}_2 SiO_{2/2})$,
 each $R^1$ is independently a monovalent hydrocarbon group,
each X is an organic group comprising carbon atoms and hydrogen atoms,
 with the proviso that X does not include a nitrogen atom,
subscript a has a value of at least 2,
subscript b has a value of at least 2,
subscript c has a value of at least 1,
subscript d has a value of at least 2,
subscript e has a value of at least 2,
subscript f has a value of at least 2,
subscript g has a value of at least 1,
subscript h has a value of at least 2,
subscript i has a value of at least 2,
subscript j has a value of at least 2, and
subscript k has a value of at least 1, and
 optionally C) a solvent, thereby forming a composition;
2) using the composition in an application selected from hot melt adhesives, pressure sensitive adhesives, or reversible elastomers; and
optionally 3) removing the solvent and/or annealing, thereby forming a Combination of Ingredients A) and B) having a different structured morphology from the structured morphology of ingredient B).

In this method, step 1) may be performed as described above. Step 2) may be performed by a method comprising applying a release coating composition comprising the combination on a web substrate. Applying may be performed by any convenient means, such as using a draw down bar. If solvent is used, solvent may be removed by heating. Methods for making release coatings for pressure sensitive adhesives are known in the art. For example, step 2) may be performed by using the Combination of Ingredient A) and B) described herein in the methods for making release tapes on web substrates disclosed in U.S. Pat. No. 5,866,222.

The web substrate can comprise woven, nonwoven, knitted or other fibrous webs, thermoplastic films, or laminates thereof. The web can be coated with the release composition by solvent or hot melt casting. A pressure sensitive adhesive can be provided on the opposite face of the web. The pressure sensitive adhesive may be any adhesive, which will releasably adhere to the release coating of the release composition. Suitable such pressure sensitive adhesives include tackified elastomer based adhesives, such as those described in U.S. Pat. No. 5,866,222.

Alternatively, the combination may be used to form an adhesive article according to the method in U.S. Patent Publication 2007/148473, where the combination described herein is used instead of the pressure sensitive adhesive layer described in U.S. Patent Publication 2007/148473. In this method, step 2) may be performed by a method comprising applying a pressure sensitive adhesive comprising the combination on a substrate, such as glass, a thermoplastic polymer (e.g., polyester, polyamide, polymethylmethacrylate, polypropylene), metal (including painted metal), fiberglass, or a ceramics. Applying may be performed by any convenient means, such as those described above. If solvent is used, solvent may be removed by heating. Methods for making pressure sensitive adhesive articles are known in the art.

EXAMPLES

The following examples are included to demonstrate the invention to one of ordinary skill. However, those of ordinary skill in the art should, in light of the present disclosure, appreciate that many changes can be made in the specific embodiments which are disclosed and still obtain a like or similar result without departing from the spirit and scope of the invention.

The following ingredients were used in the examples. PS/PDMS 1 was a trimethylsiloxy-terminated poly(styrene-block-dimethylsiloxane) copolymer having a weight average molecular weight (Mw) of 45,500 and a polydispersity of 1.15. PS/PDMS 1 contained a 31,000 g/mol styrene block and a 15,000 g/mol dimethylsiloxane block. PS/PDMS 1 was obtained from Polymer Source, Inc. Solution 1 was a solution containing 95% toluene and 5% MQ resin solids with the following characteristics: M unit of formula $(CH_3)_3SiO_{1/2}$, M/Q ratio 0.92/1, number average molecular weight (Mn) of 8,460 g/mol and Mw of 9,600 g/mol.

Examples 1 to 5

Blends were prepared by mixing varying amounts of Solution 1 with PS/PDMS 1. Samples were poured into a Teflon dish and evaporated into a chunk. After air drying to remove solvent, the blends were annealed by heating at 130° C. for 15 hours in a vacuum oven to reach the equilibrium morphology and to remove the solvent effect on the morphology. Blends were then cooled down to room temperature. The resulting annealed samples were cryo-microtomed at −120° C. to make electron transparent thin sections and loaded on a C film coated Cu TEM grid for TEM (i.e., Transmission Electron Microscopy) analysis. Each section was loaded in JEOL 2100F TEM, and the morphology was investigated under bright field TEM mode at 200 KeV. Digital images were taken using a Gatan CCD camera attached under the TEM column and Digital Micrograph software. The amounts of Solution 1 and PS/PDMS1 are in Table 1.

TABLE 1

| Sample | Amount of MQ Resin provided from Solution 1 (%) | Amount of PS/PDMS 1 (%) | Transmission Electron Micrograph Morphology confirmed by Small Angle X-Ray Scattering. |
|---|---|---|---|
| 1 (comparative) | 0 | 100 | PDMS cylinders in a PS matrix |
| 2 | 9 | 91 | PDMS cylinders in a PS matrix (same morphology as example 1) |
| 3 | 13 | 87 | Gyroid co-continuous morphology where both PDMS and PS constitute the matrix |
| 4 | 20 | 80 | Lamellar |
| 5 | 33 | 67 | Lamellar |

In example 5, the composition was made with 33% MQ Resin provided and 67% PS/PDMS. This sample had lamellar structure as measured by SAXS.

SAXS stands for small angle X-ray scattering. SAXS data for the PS-PDMS 1 mixture of MQ Resin showed morphological transition to lamellae, as the added wt % of MQ resin increased. Morphology transition from cylindrical over gyroid to lamellar controlled by addition of fractionated MQ Resin to linear PS-PDMS 1 block copolymer was confirmed using SAXS and TEM. In the SAXS data, the information of the microdomain morphology of a block copolymer could be obtained from the relative positions of the multiple Brag peaks, since they exhibited different arrays depending on the shape of the microdomain structure. In example 1, TEM and SAXS data showed the formation of hexagonally arrayed PDMS cylinders in a PS matrix in the PS-PDMS 1 block copolymer before mixing with MQ Resin. The detected peak positions in SAXS confirmed the formation of a hexagonally ordered cylindrical structure in the block copolymer. After the addition of fractionated MQ Resin, the SAXS results in examples 3 and 4 showed the morphological transition from a cylindrical structure in example 1, to a co-continuous structure in example 3, to an alternate lamellar structure in example 4. When MQ Resin (13 wt %) was added to the PS-PDMS 1 block copolymer, the peak positions in SAXS corresponded to a co-continuous (gyroid) structure in example 3. After the addition of more MQ Resin (20 wt %), the formation of a lamellar morphology was indicated in the SAXS result sin example 4. After further addition of MQ Resin (33 wt %) in example 5, there was no dramatic change of morphology for this PS-PDMS 1 and MQ Resin composition.

Example 6

Comparative

A polydimethylsiloxane (PDMS) homopolymer (trimethylsiloxy-terminated PDMS having Mw of 17,200 and a polydispersity of 1.05) was added to PS/PDMS 1 using a method as used in examples 2-5. Poor morphology control was achieved in this comparative example.

Example 7

Comparative

A resin comprised of units of the formula $(CH_3SiO_{3/2})$ was commercially available Shin Etsu Chemical Co., Ltd. as KR220L (a methyl-T silicone resin). A blend of this resin (20%) and PS/PDMS 1 (80%) was prepared as in examples 1-5. This blend did not form a structured morphology due to immiscibility of this methyl-T silicone resin with the PS-PDMS 1 block copolymer, proving that not every silicone resin is miscible with PS-PDMS block copolymer.

INDUSTRIAL APPLICABILITY

The methods described herein provide the benefit that one block copolymer may be used, instead of having to synthesize different block copolymers with blocks of different lengths, to get a desired morphology. The morphology of a single block copolymer may be changed by adding different amounts of the MQ resin until desired the morphology is obtainable.

The invention claimed is:

1. A method for modifying morphology of a copolymer comprising:
   1) combining ingredients comprising
      A) an MQ resin,
      B) a block copolymer comprising a compatible unit and an incompatible unit, where ingredient B) has capability to form a structured morphology in the absence of ingredient A), and optionally
      C) a solvent; and
   2) annealing, thereby forming a combination having a different structured morphology from the structured morphology of ingredient B).

2. The method of claim 1 where the MQ resin comprises units of formula $R_3SiO_{1/2}$, and tetrafunctional (Q) units represented by $SiO_{4/2}$, where each R is independently a monovalent hydrocarbon group.

3. The method of claim 1, where ingredient B) is a silicone-organic block copolymer.

4. The method of claim 3, where ingredient B) has a formula selected from $$E\text{-}(D_a\text{-}X_b)_c\text{-}E,$$

$$E\text{-}(D_d\text{-}X_e\text{-}D_f)_g\text{-}E,$$

$$E\text{-}(X_h\text{-}D_i\text{-}X_j)_k\text{-}E, \text{ and}$$

a combination thereof; where
   each E is an endblocking group,
   each D is a difunctional siloxane unit of formula $(R^1_2SiO_{2/2})$,
      each $R^1$ is independently a monovalent hydrocarbon group or a halogenated monovalent hydrocarbon group,
   each X is an organic group,
   subscript a has a value of at least 2,
   subscript b has a value of at least 2,
   subscript c has a value of at least 1,
   subscript d has a value of at least 2,
   subscript e has a value of at least 2,
   subscript f has a value of at least 2,
   subscript g has a value of at least 1,
   subscript h has a value of at least 2,
   subscript i has a value of at least 2,
   subscript j has a value of at least 2, and
   subscript k has a value of at least 1; and
subscripts a to k have values such that
   each block has a number average molecular weight of at least 1,000; and
   volume fraction of D units ranges from 0.01 to 0.6.

5. A method comprising:
1) combining ingredients comprising
   A) a tri-functional silicate nanoparticle,
   B) a silicone-organic block copolymer having a formula selected from $E\text{-}(D_a\text{-}X_b)_c\text{-}E$, $E\text{-}(D_d\text{-}X_e\text{-}D_f)_g\text{-}E$, $E\text{-}(X_h\text{-}D_i\text{-}X_j)_k\text{-}E$, and a combination thereof; where
      each E is an endblocking group,
      each D is a difunctional siloxane unit of formula $(R^1_2SiO_{2/2})$,
         each $R^1$ is independently a monovalent hydrocarbon group, i
      each X is an organic group comprising carbon atoms and hydrogen atoms,
         with the proviso that X does not include a nitrogen atom,
      subscript a has a value of at least 2,
      subscript b has a value of at least 2,
      subscript c has a value of at least 1,
      subscript d has a value of at least 2,
      subscript e has a value of at least 2,
      subscript f has a value of at least 2,
      subscript g has a value of at least 1,
      subscript h has a value of at least 2,
      subscript i has a value of at least 2,
      subscript j has a value of at least 2, and
      subscript k has a value of at least 1;
         subscripts a to k have values such that
            each block has a number average molecular weight of at least 1,000; and
         volume fraction of D units ranges from 0.01 to 0.6; and optionally
   C) a solvent, thereby forming a composition;
2) using the composition in an application selected from hot melt adhesives, pressure sensitive adhesives, or reversible elastomers; and optionally
3) removing the solvent; thereby forming a combination
4) annealing, thereby causing the combination to have a different structured morphology from the structured morphology of ingredient B).

6. The method of claim 5, where step 2) is performed by a method comprising coating a release composition comprising the combination on a web substrate.

7. The method of claim 1, where the amount of ingredient A) ranges from greater than 0% to 80% of the combination.

8. The method of claim 7, where the amount of ingredient A) ranges from 5% to 25% of the combination.

9. The method of claim 4, where each D is independently selected from $Me_2SiO_{2/2}$ units, $PhMeSiO_{2/2}$ units, and $Ph_2SiO_{2/2}$ units, where Me represents a methyl group and Ph represents a phenyl group.

10. The method of claim 4, where each X is independently selected from the group consisting of butyl acrylate, caprolactone, isobutylene, methyl methacrylate, propylene oxide, styrene, and vinyl naphthalene.

11. The method of claim 4, where each E is independently selected from $Me_3SiO_{1/2}$ units and $PhMe_2SiO_{1/2}$ units, where Me represents a methyl group and Ph represents a phenyl group.

12. The method of claim 4, where each E is a $Me_3SiO_{1/2}$ unit, each D is a $Me_2SiO_{2/2}$ unit, and each X is styrene, where Me represents a methyl group.

13. The method of claim 1 where the annealing step is performed by heating at a temperature of 50° C. or higher for a time ranging from 1 second to 50 hours.

14. A combination comprising:
   A) a tri-functional silicate nanoparticle,
   B) a silicone-organic block copolymer having a formula selected from $E\text{-}(D_a\text{-}X_b)_c\text{-}E$, $E\text{-}(D_d\text{-}X_e\text{-}D_f)_g\text{-}E$, $E\text{-}(X_h\text{-}D_i\text{-}X_j)_k\text{-}E$, and a combination thereof; where
      each E is an endblocking group,
      each D is a difunctional siloxane unit of formula $(R^1_2SiO_{2/2})$,
         each $R^1$ is independently a monovalent hydrocarbon group or a halogenated monovalent hydrocarbon group,
      each X is an organic group comprising carbon atoms and hydrogen atoms,
         with the proviso that X does not include a nitrogen atom,
      subscript a has a value of at least 2,
      subscript b has a value of at least 2,
      subscript c has a value of at least 1,
      subscript d has a value of at least 2,
      subscript e has a value of at least 2,
      subscript f has a value of at least 2,
      subscript g has a value of at least 1,
      subscript h has a value of at least 2,
      subscript i has a value of at least 2,
      subscript j has a value of at least 2, and
      subscript k has a value of at least 1; and
subscripts a to k have values such that
   each block has a number average molecular weight of at least 1,000; and
volume fraction of D units ranges from 0.01 to 0.6,
where the combination has a structured morphology selected from cylindrical, lamellar, and gyroid.

15. The combination of claim 14, where each D is independently selected from the group consisting of $Me_2SiO_{2/2}$ units, $PhMeSiO_{2/2}$ units, and $Ph_2SiO_{2/2}$ units, where Me represents a methyl group and Ph represents a phenyl group.

16. The combination of claim 14, where each X is independently selected from the group consisting of styrene, methyl methacrylate, isobutylene, butyl acrylate, vinyl naphthalene, propylene oxide, and caprolactone.

17. The combination of claim 14, where each E is independently selected from $Me_3SiO_{1/2}$ units and $PhMe_2SiO_{1/2}$ units, where Me represents a methyl group and Ph represents a phenyl group.

18. The combination of claim 14, where each E is a $Me_3SiO_{1/2}$ unit, each D is a $Me_2SiO_{2/2}$ unit, and each X is styrene, where Me represents a methyl group.

19. The combination of claim 14, where ingredient A) is an MQ resin comprising units of formula $R_3SiO_{1/2}$, and tetrafunctional (Q) units represented by $SiO_{4/2}$, where each R is independently a monovalent hydrocarbon group.

20. The combination of claim 14, where the combination is in the form of a thin film on a substrate.

* * * * *